Oct. 7, 1969 D. P. BURKS ETAL 3,471,753

SEMICONDUCTOR MOUNTING CHIP ASSEMBLY

Filed March 1, 1967 2 Sheets-Sheet 1

United States Patent Office 3,471,753

Patented Oct. 7, 1969

3,471,753

SEMICONDUCTOR MOUNTING CHIP ASSEMBLY

Darnall P. Burks, Williamstown, Mass., and John H. Fabricius, Stamford, Vt., assignors to Sprague Electric Company, North Adams, Mass., a corporation of Massachusetts Continuation-in-part of application Ser. No. 458,930, May 26, 1965. This application Mar. 1, 1967, Ser. No. 619,800

Int. Cl. H01l 3/00, 5/00

U.S. Cl. 317—234 9 Claims

ABSTRACT OF THE DISCLOSURE

At least one semiconductor device is mounted in electrical connection on a conductive pad which extends to an edge of a mounting chip. The semiconductor device is electrically connected by a lead to another conductive pad which extends to a corner of the mounting chip. A protective coating is provided over the semiconductive device and the lead with the conductive pads extending beyond the coating.

CROSS-REFERENCE TO RELATED APPLICATIONS

This application is a continuation-in-part of U.S. patent application 458,930 filed May 26, 1965 which issued Mar. 26, 1968 as U.S. 3,374,533.

BACKGROUND OF THE INVENTION

The present invention relates to a semiconductor mounting assembly and more particularly to a semiconductor mounting arrangement.

Present mounting arrangements of semiconductor devices, such as diodes, transistors or integrated circuit units, on circuit substrates are subject to a number of disadvantages. For example, present arrangements are costly, and no provision is made for safe handling for inspection, etc. The prior art arrangements fail to provide for the high frequency testing and matching of characteristics, and for the protection of the leads of the device before it is assembled to the circuit substrate. Additionally, the lead arrangements are relatively long, and, consequently, lead inductance is high. Moreover, in many cases there are power losses associated with ferromagnetic packaging materials, and these arrangements do not generally lend themselves to automated assembly.

SUMMARY OF THE INVENTION

In general this invention provides an assembly in which at least one semiconductive device is mounted on an insulative surface of a mounting chip with elements of the device in connection to conductive pads thereon and with a covering over the device and its leads, and at least one pad extends from beneath the covering to an edge of the chip. This provides a mounting arrangement which minimizes ferromagnetic packaging materials and lead inductance, and also provides an arrangement suitable for handling, testing and matching of units before attachment to a circuit substrate, as well as convenient terminals for connection to the latter.

DESCRIPTION OF THE PREFERRED EMBODIMENTS

Figure 1:
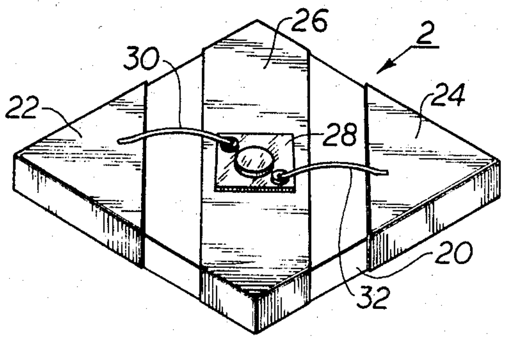
FIGURE 1 is a perspective view of a semiconductor assembly of the invention without its protective covering.

FIGURE 1 shows a chip assembly 2 having a semiconductor device 28, such as a transistor or the like, attached to a mounting chip 20 in connection to metallized areas or pads 22, 24 and 26. The mounting chip 20, or at least the surface beneath the pads, is made of insulating material such as glass, alumina, beryllia or the like.

In this embodiment, two opposite corners of mounting chip 20 are provided with metallized pads 22 and 24, and an intermediate pad 26 extends diagonally across wafer, or chip, 20 between pads 22 and 24. Pads 22, 24 and 26 are applied to chip 20 by metallizing, silk screening, evaporating, plating, laminating, or other suitable means. However, in the preferred method the chip is first metallized with molybdenum-manganese or molybdenum-titanium or the like, which is then plated with nickel or gold.

Semiconductor 28 is secured to mounting chip 20, by, for example, brazing or soldering its collector to pad 26. It is also in conductive relationship with metallized areas 22 and 24 by means of a pair of leads 30 and 32 respectively, which connect its emitter and base regions to these pads. Finally, for chip assemblies which will be subjected to handling, storage or shipping, etc., a sealing coating of epoxy or the like is deposited over unit 28. This coating is employed in all the embodiments; however, for reasons of clarity, it is shown only in FIGURE 3.

Accordingly, mounting chip 20 and its semiconductor 28 provide a convenient assembly which permits safe handling for inspection, etc., since the leads are contained within the bounds of the chip and are covered. Moreover, chip 20 also provides large area terminals for electrical test purposes which permit high frequency testing and matching of devices before the unit is made available for circuit use. Additionally, this arrangement reduces the lead length, thereby reducing lead inductance, and eliminates losses associated with ferromatic packaging material. Moreover, the uniformity and polarization of shape of the chip also permits automated testing and assembly to the substrate.

As shown in FIGURE 1, the metallized areas may occupy a substantial portion of the upper surface of chip 20. For example, in one embodiment chip 20 is a square 0.060 inch long on each side. Pads 22 and 24 are made in the form of isosceles triangles which have a pair of sides 0.020 inch long, and the central pad 26 is a strip having parallel sides, spaced 0.015 inch from the corners of chip 20.

Figure 2:
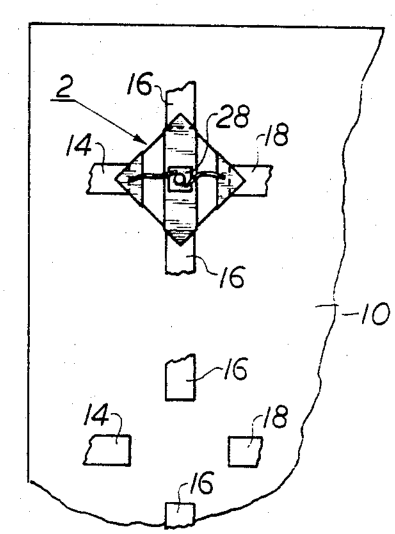
FIGURE 2 is a plan view of a circuit substrate illustrating a circuit mounting arrangement of the assembly of FIGURE 1.

In the preferred embodiment, the metallized pads are brought over the edge, as shown, to facilitate circuit connection to the circuit substrate 10, as shown in FIGURE 2. In circumstances where it is not advisable to bring the pads over the edge, however, the substrate may be made quite thin, in the order of 0.010 inch, so as to enhance the bridging of the solder, or other conductive material, employed to connect the chip pads to the circuit substrate.

As indicated, various means of depositing the conductive pads may be utilized. However, in the preferred process, this is accomplished by coating the full surface, including the edges, of the chip with metallizing such as molybdenum-manganese or the like, and thereafter plating this area. Then the individual pads may be formed by saw cuts made through the conductive coating (including portions on the chip edge) or by photolithographic etching techniques or the like.

Referring now to FIGURE 2 wherein is shown a circuit substrate 10 having a chip assembly 2 in connection to circuit contacts or lands 14, 16, and 18 which in turn connect to other circuit portions (not shown), including similar chip assemblies. The circuit substrate 10 may be of an insulating material similar to chip 20, and circuit lands 14, 16, and 18 may be deposited by any suitable means; for example, those described for the pads of chip 20.

Figure 3:
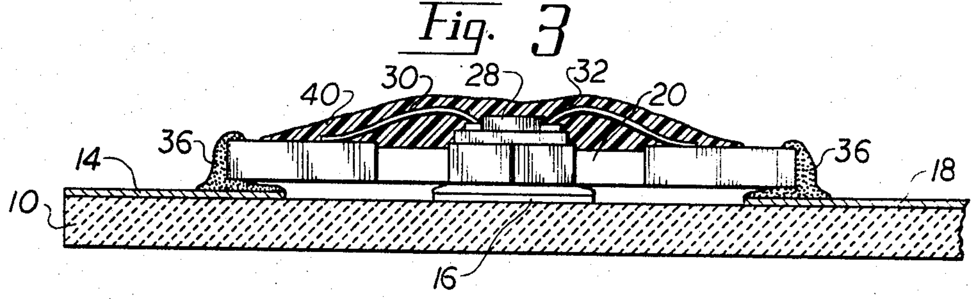
FIGURE 3 is a view partly in section of the attached assembly of FIGURE 2 including its protective coating.

Advantageously, as shown in FIGURE 3, pads 22, 24 and 26 of chip 20 are secured in conductive relationship to their respective circuit lands 14, 18 and 16 by, for example, soldering material 36, which also effectively attaches chip 20 to substrate 10. The sealing cover 40, which is generally applied to the chip assembly before connection to the circuit substrate, is employed to seal semiconductor 28 to chip 20. This coating 40, which is an epoxy or the like, generally does not extend to the edge of chip 20 so that pads 22, 24, and 26 extend from beneath it. This provides a large contact area adjacent the chip edge and enhances connection to the circuit substrate, since the solder 36 may be brought over the edge.

For this reason, the corner locations of the pads is advantageous, since the resin coatings will generally form a circular pattern over the device and its leads, and is not so apt to flow over the corners. Thus it naturally leaves the corner portions of the pads uncoated and provides a clean termination for circuit connection.

Of course, many different chip assemblies and pad configurations are suitable. The sizes may vary widely, since each is determined to some extent by the actual semiconductor device employed and the number accommodated. In this regard, it should be understood that semiconductor device, as used herein, includes but is not limited to diodes, transistors, microcircuits, etc. Thus, preferred chip sizes range from .060 x .100 inch to .125 x .150 inch with a thickness of approximately .015 inch.

Figure 4:
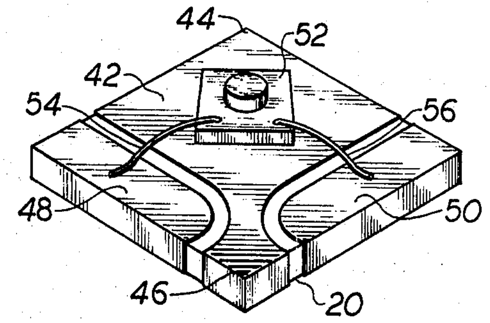
FIGURE 4 is a perspective view of another semiconductor assembly, without its covering, which illustrates a modified mounting arrangement for a three terminal semiconductor.

Thus, different pad configurations will be useful. For example, as shown in FIGURE 4, the center pad 42 is reduced at one corner 44 and enlarged at the opposing corner 46 of chip 20, while pads 48 and 50 extend from each of the remaining corners toward the narrow portion of pad 42. This configuration allows a large off-center pad area for mounting of a component 52, while permitting contact to pad 42 from opposite corners of the chip. This off-center mounting conveniently permits the leads 54 and 56 of the device 52 to extend to the sides, or forward from the device as shown.

Figure 5:
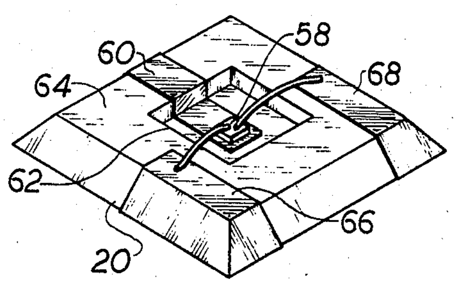
FIGURE 5 is a perspective view of a further embodiment which illustrates attachment of the semiconductor within a recess of the chip.

FIGURE 5 illustrates a further modification in which a device 58 is attached within a recess of the chip. Herein, a semiconductor device 58 is mounted on a pad 60 within a recess 62 of chip 20. Pad 60 extends from the recess to the upper surface 64 and a pair of pads 66 and 68 on surface 64 are in connection to leads of the device. This recessed mounting provides added protection to the device. In this case, the coating (not shown in this figure) will fill the recess while also spreading over surface 64 so as to cover the leads.

In this embodiment, the chip is approximately .015 inch thick, and has a recess of about .005 inch deep. The edges of the chip are beveled, as shown, with pads 60, 66 and 68 extended on the bevel to permit a large surface area for connection to the circuit substrate. Of course, the bevel which is most suitable for thick chips is useful in any assembly.

Figure 6:
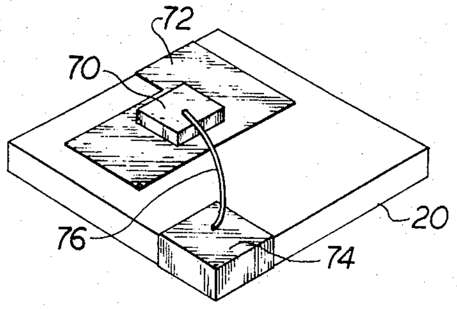
FIGURE 6 is a perspective view of a semiconductor assembly illustrating a mounting arrangement for a two terminal device.

Although the assemblies described above may be utilized for two as well as three element devices, it is sometimes desirable to provide a pad configuration specifically designed for the former. This is illustrated, for example, in FIGURE 6 wherein a two element device 70 is secured and electrically connected to a large pad 72 which extends from one edge to a generally central area of chip 20. A smaller pad 74 is provided at another edge, or corner of the chip, and is in connection with the other element of diode 70 by means of lead 76.

As indicated, many different pad configurations are possible, depending upon the particular type or number of devices to be mounted. Thus, for example, FIGURES 7 and 8 and 9 illustrate embodiments in which more than one device is provided on a single chip.

Figure 7:
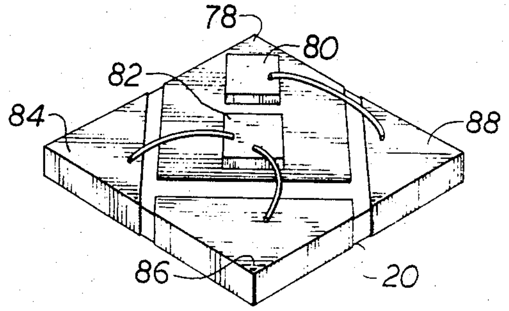
FIGURES 7, 8 and 9 are perspective views of other embodiments suitable for mounting of a plurality of semiconductor devices.

In FIGURE 7 a large central pad 78, extended from one corner of a chip 20, permits a common connection to two devices 80 and 82, which are mounted on it. In this example, device 80 is a two element device, such as a diode, whereas unit 82 is a three element device, such as a transistor. Three smaller pads 84, 86, and 88 are clustered around pad 78 at the remaining corners of chip 20. As indicated, a common connection to device 80 and 82 is provided by their mounting connection to pad 78. The remaining elements are individually connected by leads to pads 84, 86 and 88. Unit 80 in this case is connected to pads 78 and 88 while component 82 is connected to pads 78, 84 and 86 as shown.

Figure 8:
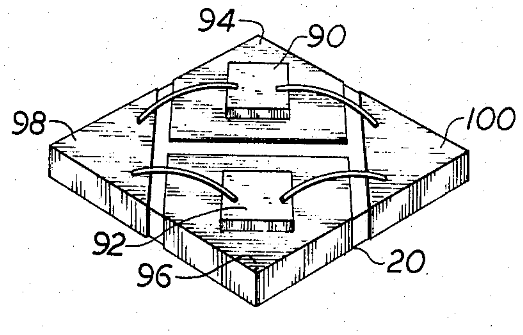

In FIGURE 8 a slightly different arrangement, suitable for the mounting of a pair of three element devices 90 and 92, is shown. In this case, separate mounting terminals are provided for each device by two large corner pads 94, 96 while common connections for other elements are provided by side pads 98 and 100 to which device leads are attached as shown. This configuration allows for common emitter and common base connection, or the like.

Figure 9:
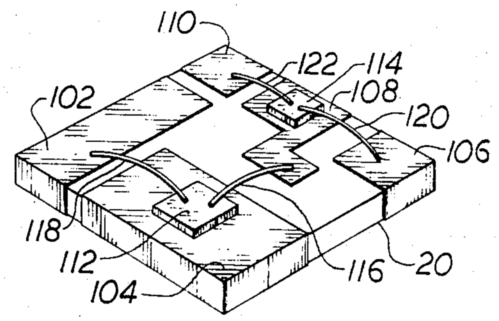
Figure 10:
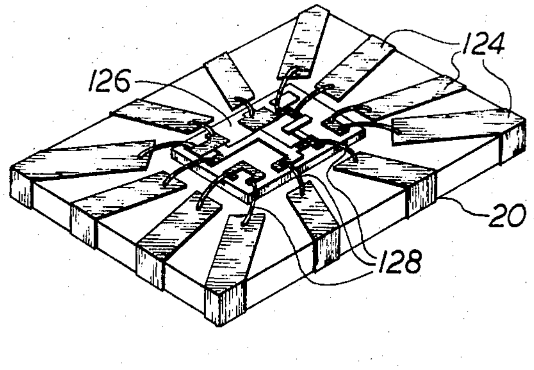
FIGURE 10 is a perspective view of a mounting arrangement for a microcircuit.

The pad configurations of FIGURE 9, on the other hand, are designed for a common connection between different elements of similar devices. In this case, five pads 102, 104, 106 and 108 and 110 are provided around the chip perimeter, and three element devices, such as transistors or the like, are mounted on and connected to pads 104 and 108 respectively.

In this case, their collectors are connected to the mounting pads. One of the other elements of transistor 112 is also connected by lead 116 to pad 108 and, through the latter, to the collector of unit 114. The remaining element of unit 112 is connected to an adjacent pad 102 by lead 118. Transistor 114, on the other hand, is connected by leads 120 and 122 to the remaining pads 106 and 110 respectively. This configuration then permits individual circuit connection to elements of both units except for the common connection between them.

Advantageously, the chip assembly may also be employed for circuit units such as microcircuits or integrated circuits or the like, as shown in FIGURE 9. In this arrangement, a multiplicity of pads 124 are arranged on the surface of chip 20, and, as in the other embodiments, each pad extends to, and usually over, the chip edge. A microcircuit or other multi-component unit 126 is centered on the chip in connection to each pad by means of leads 128.

As shown, pads 124 extend inward from the chip edge to a point adjacent device 126; however, one or more pads could also extend beneath the unit to contact elements or connections on that side. In any event, the microcircuit 126 is secured to the chip with its elements in contact to the adjacent pads. Thereafter, unit 126 and its leads 128 are protected by a cover of epoxy or the like, and the pads extend from beneath the coating as in other embodiments.

As indicated, the chip pads can be provided in a number of ways. For example, the chip may be provided with three holes (not shown) in which metal balls of gold or silver or platinum or the like are mounted by suitable means to provide through contacts on the chip. These may be secured in the chip by soldering or fusing to the metallized walls of the holes, or by flattening or swaging the balls in place. In an alternative form, gold or silver rivets may be employed.

As in other embodiments, the pads may be made in many different patterns. For example, the holes may be formed in triangular patterns. They may also include an enlarged central hole flanked by a pair of smaller corner holes in which case, the semiconductor collector would then be secured on the ball or rivet pad of the enlarged central hole and the emitter and base connected to the pads provided in the other holes.

Still further modifications of the chip assembly are possible. As indicated, the metallized pads may be varied in a number of ways. Moreover, the chip may also be provided in circular, triangular or other shape, and may include any appropriate pad configuration.

What is claimed is:

1. A semiconductor assembly comprising a mounting chip having a substantially planar insulative surface, a plurality of conductive pads on said surface, each of said pads extended over an edge of said surface including at least one of said pads extended over a corner of said chip, at least one semiconductor device mounted in electrical connection on one of said pads and in conductive relationship with said at least one of said pads by a lead, a protective coating over said device and said lead, and said pads extended from beneath said coating on said surface.

2. An assembly as claimed in claim 1 wherein said edge is beveled, and said at least one of said pads extends over said bevel.

3. An assembly as claimed in claim 1 including a plurality of devices secured in conductive relationship to said pads.

4. An assembly as claimed in claim 3 wherein one element of at least two of said devices are connected in conductive relationship to a common pad of said chip.

5. An assembly as claimed in claim 4 wherein said conductive relationship to said common pad is provided by mounting said devices on said common pad.

6. An assembly as claimed in claim 1 including an intermediate pad between a pair of pads, and said device having one element secured in conductive relationship to said intermediate pad and leads connecting other elements to said pair.

7. An assembly as set forth in claim 6 wherein said mounting chip is a square, said pair of conductive pads being on opposite corners of said chip, and said intermediate conductive pad extending diagonally across said chip.

8. An assembly as claimed in claim 1 including a recess in said chip, and said device is mounted in said recess with leads in connection to pads of the upper surface of said chip.

9. An assembly as claimed in claim 8 including a pad extended from an edge of said chip to within said recess and said device is mounted on said pad in conductive relationship thereto.

References Cited

UNITED STATES PATENTS

| | | | |
|---|---|---|---|
| 2,971,138 | 2/1961 | Meisel et al. | 317—234 |
| 3,302,067 | 1/1967 | Jackson et al. | 317—101 |
| 3,349,481 | 10/1967 | Karp | 29—697 |
| 3,021,461 | 2/1962 | Oakes et al. | 317—234 |
| 3,231,797 | 1/1966 | Koch | 317—234 X |
| 3,254,274 | 5/1966 | Garcia et al. | 317—234 |
| 3,271,507 | 9/1966 | Elliott | 317—234 |
| 3,331,125 | 7/1967 | McCusker | 317—234 X |

FOREIGN PATENTS

| | | |
|---|---|---|
| 932,210 | 7/1963 | Great Britain. |
| 1,099,888 | 9/1955 | France. |
| 1,446,305 | 6/1966 | France. |

JOHN W. HUCKERT, Primary Examiner

R. F. POLISSACK, Assistant Examiner

U.S. Cl. X.R.

174—68.5; 317—101, 235